(12) United States Patent
Nagata et al.

(10) Patent No.: US 9,090,970 B2
(45) Date of Patent: Jul. 28, 2015

(54) HIGH-PURITY COPPER-MANGANESE-ALLOY SPUTTERING TARGET

(75) Inventors: Kenichi Nagata, Ibaraki (JP); Tomio Otsuki, Ibaraki (JP); Takeo Okabe, Ibaraki (JP); Nobuhito Makino, Ibaraki (JP); Atsushi Fukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/118,591

(22) PCT Filed: Sep. 6, 2012

(86) PCT No.: PCT/JP2012/072726
§ 371 (c)(1),
(2), (4) Date: Nov. 19, 2013

(87) PCT Pub. No.: WO2013/038983
PCT Pub. Date: Mar. 21, 2013

(65) Prior Publication Data
US 2014/0097084 A1 Apr. 10, 2014

(30) Foreign Application Priority Data
Sep. 14, 2011 (JP) ................................. 2011-200905

(51) Int. Cl.
C22C 9/05 (2006.01)
C23C 14/34 (2006.01)
C22F 1/08 (2006.01)
C22F 1/00 (2006.01)

(52) U.S. Cl.
CPC .............. C23C 14/3414 (2013.01); C22C 9/05 (2013.01); C22F 1/08 (2013.01); C22F 1/00 (2013.01)

(58) Field of Classification Search
CPC .................................................. C23C 14/3414
USPC ................................................ 148/536, 332
See application file for complete search history.

(56) References Cited

U.S. PATENT DOCUMENTS

| | | | |
|---|---|---|---|
| 6,896,748 B2 | 5/2005 | Perry et al. | |
| 7,229,510 B2 | 6/2007 | Nakamura | |
| 7,507,304 B2 | 3/2009 | Okabe et al. | |
| 7,626,665 B2 | 12/2009 | Koike | |
| 7,713,364 B2 | 5/2010 | Nakamura | |
| 7,740,721 B2 | 6/2010 | Okabe | |
| 8,246,764 B2 | 8/2012 | Okabe et al. | |
| 2004/0072009 A1 | 4/2004 | Segal et al. | |
| 2005/0121320 A1 | 6/2005 | Okabe et al. | |
| 2007/0051624 A1 | 3/2007 | Okabe et al. | |
| 2009/0101495 A1* | 4/2009 | Aoki et al. | 204/298.13 |
| 2009/0140430 A1 | 6/2009 | Okabe et al. | |
| 2010/0013096 A1* | 1/2010 | Irumata et al. | 257/741 |
| 2010/0059147 A9* | 3/2010 | Segal et al. | 148/536 |
| 2010/0219070 A1 | 9/2010 | Okabe | |
| 2011/0163447 A1 | 7/2011 | Fukushima et al. | |
| 2014/0158532 A1 | 6/2014 | Nagata et al. | |
| 2014/0284211 A1 | 9/2014 | Nagata et al. | |

FOREIGN PATENT DOCUMENTS

| | | |
|---|---|---|
| JP | H02-119140 A | 5/1990 |
| JP | 2002-294437 A | 10/2002 |
| JP | 2004-052111 A | 2/2004 |
| JP | 2005-533187 A | 11/2005 |
| JP | 2006-073863 A | 3/2006 |
| JP | 2008-311283 A | 12/2008 |
| JP | 2009-074127 A | 4/2009 |
| JP | 2009-097085 A | 5/2009 |
| JP | 2010-248619 A | 11/2010 |
| WO | 03/064722 A1 | 8/2003 |
| WO | 2004/083482 A1 | 9/2004 |
| WO | 2008/041535 A1 | 4/2008 |

\* cited by examiner

*Primary Examiner* — Keith Hendricks
*Assistant Examiner* — Timon Wanga
(74) *Attorney, Agent, or Firm* — Howson & Howson LLP

(57) ABSTRACT

Provided is a high-purity copper-manganese-alloy sputtering target comprising 0.05 to 20 wt % of Mn and the remainder being Cu and inevitable impurities. The high-purity copper-manganese-alloy sputtering target is characterized in that the in-plane variation (CV value) in Mn concentration of the target is 3% or less. It is thus possible to form a thin film having excellent uniformity by adding an appropriate amount of a Mn element to copper and reducing the in-plane variation of the sputtering target. In particular, there is provided a high-purity copper-manganese-alloy sputtering target which is useful for improving the yield and the reliability of semiconductor products which are making progress in a degree of refinement and integration.

7 Claims, No Drawings

HIGH-PURITY COPPER-MANGANESE-ALLOY SPUTTERING TARGET

BACKGROUND

The present invention relates to a high-purity copper-manganese-alloy that has a self-diffusion suppression function useful and suitable for forming semiconductor copper alloy wiring and can effectively prevent contamination of the periphery of the wiring due to diffusion of active copper. In particular, the invention relates to a high-purity copper-manganese-alloy sputtering target that can form a thin film having excellent uniformity.

Conventionally, Al alloys (specific resistance: about 3.0 $\mu\Omega\cdot cm$) were used as a wiring material of semiconductor elements. However, copper wiring having a lower resistance (specific resistance: about 2.0 $\mu\Omega\cdot cm$) has been put into practical use with miniaturization of wiring. Copper wiring is generally formed by forming a diffusion barrier layer of, for example, Ta or TaN in wiring or wiring grooves and then forming a film of copper by sputtering. Generally, copper having a high purity of 5N to 6N is produced from electrolytic copper having a purity of about 4 N (excluding gas components) as a crude metal by a wet or dry purification process, and the purified copper is used as a sputtering target.

As described above, copper is very effective for semiconductor wiring. However, copper itself is a very active metal and easily diffuses, and therefore causes a problem of contaminating a Si substrate or its periphery through the semiconductor Si substrate or the insulating film thereon. In particular, with progress in miniaturization of wiring, the problem cannot be sufficiently prevented by the conventional diffusion barrier layer of Ta or TaN only, and copper wiring materials themselves are also required to be improved. Accordingly, as a copper wiring material, a Cu—Mn alloy, which is a copper alloy prepared by adding manganese (Mn) to copper (Cu), having a self-diffusion suppression function by forming a barrier layer by itself through a reaction of Mn in the alloy with oxygen in an insulating film has been proposed.

The semiconductor copper alloy wiring is formed using a copper-manganese alloy sputtering target. In such semiconductor copper alloy wiring, the in-plane variation in thickness or sheet resistance of the wiring layer, which has not conventionally caused any problem, causes a problem of reducing the yield of chips product) prepared from a wafer, with progresses of miniaturization, density growth, and integration of semiconductor devices and with progresses of miniaturization and increase in number of wiring layers. Accordingly, there is a demand for a copper-manganese alloy sputtering target that can form a thin film (wiring) with less variation.

The followings are examples of the Cu—Mn alloy sputtering target:

Patent Literature 1 describes a sputtering target composed of 0.1 to 20.0 at % of Mn, 0.05 at % or less of inevitable impurity elements having diffusion coefficients lower than the self-diffusion coefficient of Cu, and the remainder being Cu;

Patent Literature 2 describes a sputtering target composed of 0.1 to 1.0 at % of B as an additive element, 0.1 to 2.0 at % of Mn and/or Ni, and the remainder being Cu and inevitable impurities;

Patent Literature 3 describes a sputtering target composed of 0.1 to 1.0 at % of B as an additive element, 0.1 to 2.0 at % of an element (including Mn) that forms a compound with B, and the remainder being Cu and inevitable impurities;

Patent Literature 4 describes a sputtering target composed of at least one component selected from the group consisting of V, Nb, Fe, Co, Ni, Zn, and Mg and at least one component selected from the group consisting of Sc, Al, Y, and Cr in a total amount of 0.005 to 0.5% by mass, 0.1 to 5 ppm of oxygen, and the remainder being Cu and inevitable impurities;

Patent Literature 5 describes a sputtering target composed of oxygen in an amount higher than 6% by mole and 20% by mole or less, at least one selected from Mo, Mn, Ca, Zn, Ni, Ti, Al, Mg, and Fe in a total of 0.2 to 5% by mole, and the remainder being Cu and inevitable impurities;

Patent Literature 6 describes a sintered sputtering target material composed of a metal powder of Mn, B, Bi, or Ge and an alloy powder or sintered metal containing X (including Cu) and Y, in which the amount of crystal grains having an average particle diameter of 0.1 to 300 μm is 50% or more, and the amount of gas included is 600 ppm or less; and Patent Literature 7 describes a sputtering target composed of 0.6 to 30% by mass of Mn for suppressing occurrence of particles, 40 ppm or less of metal based impurities, 10 ppm or less of oxygen, 5 ppm or less of nitrogen, 5 ppm or less of hydrogen, 10 ppm or less of carbon, and the remainder being Cu.

In these sputtering targets, however, the in-plane variation of the copper-manganese alloy thin film formed on a wafer is not necessarily low.

Furthermore, the present applicant has proposed a semiconductor element wiring material, which is a sputtering target for forming semiconductor copper alloy wiring and composed of Mn in an amount of 0.05 to 5 wt %, at least one element selected from Sb, Zr, Ti, Cr, Ag, Au, Cd, In, and As in a total amount of 10 wt ppm or less, and the remainder being Cu (see Patent Literature 8).

This is effective for enhancing the self-diffusion suppression function, but the purpose thereof is not a reduction in in-plane variation of the copper-manganese alloy thin film formed on a wafer.

The present applicant has disclosed a semiconductor copper alloy wiring material composed of a Cu—Mn alloy (see Patent Literature 9), in particular, has proposed a sputtering target composed of 0.05 to 20 wt % of Mn, a total amount of 500 wt ppm or less of Be, B, Mg, Al, Si, Ca, Ba, La, and Ce, and the remainder being Cu and inevitable impurities.

This is also effective for enhancing the self-diffusion suppression function, but the purpose thereof is not a reduction in in-plane variation of the copper-manganese alloy thin film formed on a wafer.

Patent Literature 1: Japanese Patent No. 4065959
Patent Literature 2: Japanese Patent Laid-Open No. 2009-97085
Patent Literature 3: Japanese Patent Laid-Open No. 2010-248619
Patent Literature 4: Japanese Patent Laid-Open No. 2002-294437
Patent Literature 5: Japanese Patent Laid-Open No. 2008-311283
Patent Literature 6: Japanese Patent Laid-Open No. 2009-74127
Patent Literature 7: Japanese Patent Laid-Open No. 2007-51351
Patent Literature 8: Japanese Patent Laid-Open No. 2006-73863
Patent Literature 9: International Publication No. WO2008/041535

SUMMARY OF THE INVENTION

It is an object of the present invention to form a thin film having excellent uniformity by adding an appropriate amount of a Mn element to copper and reducing the in-plane variation of a sputtering target. This can improve the yield and the reliability of semiconductor products which have made progress in a degree of refinement and integration. In addition, the invention provides a high-purity copper-manganese-alloy sputtering target useful for forming semiconductor copper alloy wiring having a self-diffusion suppression function, capable of effectively preventing the periphery of the wiring from being contaminated by diffusion of active Cu, and having excellent electron migration (EM) resistance, corrosion resistance and the like.

In order to solve the above-mentioned problems, the present invention provides:

1) A high-purity copper-manganese-alloy sputtering target comprising 0.05 to 20 wt % of Mn and the remainder being Cu and inevitable impurities, wherein the target has an in-plane variation (CV value) in Mn concentration of 3% or less;

2) The high-purity copper-manganese-alloy sputtering target comprising 0.05 to 20 wt % of Mn and the remainder being Cu and inevitable impurities according to Claim 1, wherein the target has an in-plane variation (CV value) in Vickers hardness of 15% or less;

3) The high-purity copper-manganese-alloy sputtering target comprising 0.05 to 20 wt % of Mn and the remainder being Cu and inevitable impurities according to Claim 1 or 2, wherein the target has an in-plane variation (CV value) in electrical conductivity of 3% or less; and 4) The high-purity copper-manganese-alloy sputtering target comprising 0.05 to 20 wt % of Mn and the remainder being Cu and inevitable impurities according to any one of Claims 1 to 3, wherein the target has an in-plane variation (CV value) in thermal conductivity of 5% or less.

The high-purity copper-manganese-alloy sputtering target of the present invention can form a thin film having excellent uniformity in the thickness by adding an appropriate amount of a Mn element to copper and reducing the in-plane variation of the sputtering target. As a result, the yield and the reliability of semiconductor products which have made progress in a degree of refinement and integration, can be improved. In addition, the sputtering target has a self-diffusion suppression function and has excellent effects of effectively preventing the periphery of the wiring from being contaminated by diffusion of active Cu and of enhancing, for example, electron migration (EM) resistance and corrosion resistance.

DETAILED DESCRIPTION

In the present invention, desirably, the amount of Mn contained in a Cu alloy is 0.05 wt % or more and 20 wt % or less. An amount of Mn less than 0.05 wt % reduces the self-diffusion suppression function whereas an amount of Mn exceeding 20 wt % increases the resistance and thereby disadvantageously reduces the function as semiconductor copper alloy wiring. A copper alloy containing 0.5 to 10 wt % of Mn is further preferred.

In the present invention, desirably, the in-plane variation (CV value) of the Mn concentration in the target surface is 3% or less. If the in-plane variation of the Mn concentration in the target surface exceeds 3%, the compositional deviation is caused in the thin film formed by sputtering to disadvantageously cause an increase in change of the sheet resistance.

The change in sheet resistance is used for evaluating uniformity in film thickness. The CV value is calculated by the expression: [(standard deviation)/(mean value)]×100(%).

In the present invention, desirably, the in-plane variation (CV value) of the Vickers hardness on the target surface is 15% or less. If the in-plane variation of the Vickers hardness on the target surface exceeds 15%, changes in film-forming rate and sputtering rate of Mn disadvantageously increase. Accordingly, the in-plane variation of the Vickers hardness should be controlled to be 15% or less. The average Vickers hardness is 60 to 95 Hv.

In the present invention, desirably, the in-plane variation (CV value) of the electrical conductivity on the target surface is 3% or less. In addition, the in-plane variation (CV value) of the thermal conductivity is 5% or less. If the in-plane variation of the electrical conductivity on the target surface exceeds 3% or the in-plane variation of the thermal conductivity exceeds 5%, changes in film-forming rate and sputtering rate of Mn disadvantageously increase. The mean value of the electrical conductivities is 0.18 to 30 µm·cm, and the mean value of the thermal conductivities is 20 to 400 $W \cdot m^{-1} \cdot K^{-1}$.

In the production of the high-purity copper-manganese-alloy sputtering target in the present invention, high-purity copper having a purity of 6 N or more and manganese, an additive element, having a purity of 5 N or more are molten in a carbon crucible. Alternatively, high-purity copper having a purity of 6 N or more is molten in a carbon crucible in advance, and manganese having a purity of 5 N or more is then added thereto so as to give a desired component composition.

A high-purity copper-manganese-alloy ingot containing 0.05 to 20 wt % of Mn can be obtained by casting the resulting alloy. Subsequently, the ingot of a copper-manganese-alloy is hot-forged at a predetermined forging ratio, followed by rolling at a predetermined rolling reduction to give a rolled sheet.

The rolled sheet is further heat-treated at a predetermined temperature for a predetermined time and is then bonded to a backing plate, followed by finishing processing. Thus, a sputtering target assembly is produced from a high-purity copper-manganese-alloy.

In the present invention, the Mn composition was measured with an ICP-AES. The Vickers hardness was measured with a micro-Vickers meter (digital micro-hardness tester), model MMT-X7 manufactured by Matsuzawa, with a load of 100 g. The electrical conductivity was measured with a four-probe resistance measuring device, model RESISTEST-9 manufactured by Napson Corporation. The thermal conductivity was measured with a thermal microscope, model TM-3 manufactured by Bethel Co., Ltd. The in-plane variation in each factor was determined by measuring the factor at random nine points on a target surface and calculating the mean value and standard deviation thereof.

EXAMPLES

The present invention will now be described based on examples. The following examples are intended to facilitate understanding and do not limit the present invention. That is, modifications and other examples based on the technical idea of the present invention are included in the present invention.

Example 1 and Comparative Example 1

In Example 1, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 60t, followed by forging at a forging ratio of 4.8 to give φ200 and then rolling at a rolling reduction of 60% to give φ440× 10t. After heat treatment at 350° C. for 1 hour, the entire rolled plate that was heated to the heat treatment temperature was rapidly cooled to give a target material, followed by machining into a target having a diameter of 430 mm and a thickness of 7 mm.

In Comparative Example 1, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 2.3 to give φ200 and then rolling at a rolling reduction of 50% to give φ440×10t. After heat treatment at 300° C. for 15 minutes, the entire rolled plate that was heated to the heat treatment temperature was rapidly cooled to give a target material, followed by machining into a target having a diameter of 430 mm and a thickness of 7 mm.

Table 1 shows the results of measurement of Mn compositions of these targets.

As shown in Table 1, the in-plane variation (CV value) of the Mn composition in Example 1 was 2.4% to give a target having a lower in-plane variation of the Mn composition compared to 3.8% in Comparative Example 1.

Subsequently, thin films were formed by sputtering the targets of Example 1 and Comparative Example 1 for evaluating the qualities of thin films formed by sputtering. The sheet resistance of each formed thin film was measured, and the uniformity in thickness of the film was calculated. The results are shown in Table 1. The uniformity was calculated from the mean value and the standard deviation of sheet resistance values at random 49 points on the thin film formed on a wafer by the expression: [(standard deviation of sheet resistance values of 49 points)/(mean value of sheet resistance values of 49 points)]×100(%).

As shown in Table 1, the thin film formed using the target of Example 1 has a thickness uniformity of 2.9%. Thus, the results show that the film thickness uniformity is satisfactory even if sputtering continues for a long time, compared to the film thickness uniformity of 4.8% in the case using the target of Comparative Example 1.

Example 2 and Comparative Example 2

In Example 2, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 60t, followed by forging at a forging ratio of 4.8 to give φ200 and then rolling at a rolling reduction of 80% to give φ440× 10t. After heat treatment at 350° C. for 1 hour, the entire rolled plate that was heated to the heat treatment temperature was rapidly cooled to give a target material, followed by machining into a target having a diameter of 430 mm and a thickness of 7 mm.

In Comparative Example 2, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 2.3 to give φ200 and then rolling at a rolling reduction of 40% to give φ440×10t. After heat treatment at 300° C. for 15 minutes, the entire rolled plate that was heated to the heat treatment temperature was rapidly cooled to give a target material, followed by machining into a target having a diameter of 430 mm and a thickness of 7 mm.

Table 2 shows the results of measurement of Mn composition and Vickers hardness of these targets.

As shown in Table 2, the in-plane variation (CV value) of the Mn composition in Example 2 was 2.3% to give a target having a lower in-plane variation of the Mn composition compared to 3.8% in Comparative Example 2. The in-plane variation (CV value) of the Vickers hardness in Example 2 was 14.2% to give a target having a lower in-plane variation of the Vickers hardness compared to 16.5% in Comparative Example 2.

Subsequently, thin films were formed by sputtering the targets of Example 2 and Comparative Example 2 for evaluating the qualities of thin films formed by sputtering. The sheet resistance of each formed thin film was measured, and the uniformity in thickness of the film was calculated. The results are shown in Table 2.

TABLE 1

| | Forging ratio | Rolling reduction (%) | Heat treatment temperature (° C.) | Heat treatment time (min) | Mn composition In-plane CV value (%) | | Uniformity (Life average) |
|---|---|---|---|---|---|---|---|
| Example 1 | 4.8 | 60 | 350 | 60 | ○ | 2.4 | 2.9 |
| Comparative Example 1 | 2.3 | 50 | 300 | 15 | x | 3.8 | 4.8 |

As shown in Table 2, the thin film formed using the target of Example 2 has a thickness uniformity of 2.7%. Thus, the results show that the film thickness uniformity is satisfactory even if sputtering continues for a long time, compared to the film thickness uniformity of 5.2% in the case using the target of Comparative Example 2.

having a lower variation of the Mn composition compared to 3.7% in Comparative Example 3. The in-plane variation (CV value) of the electrical conductivity in Example 3 was 2.4% to give a target having a lower in-plane variation of the electrical conductivity compared to 4.2% in Comparative Example 3.

TABLE 2

|  | Forging ratio | Rolling reduction (%) | Heat treatment temperature (° C.) | Heat treatment time (min) | Mn composition In-plane CV value (%) | | Hardness In-plane CV value (%) | | Uniformity (Life average) |
|---|---|---|---|---|---|---|---|---|---|
| Example 2 | 4.8 | 80 | 350 | 60 | ○ | 2.3 | ○ | 14.2 | 2.7 |
| Comparative Example 2 | 2.3 | 40 | 300 | 15 | x | 3.8 | x | 16.5 | 5.2 |

Example 3 and Comparative Example 3

In Example 3, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 60t, followed by forging at a forging ratio of 4.8 to give φ200 and then rolling at a rolling reduction of 70% to give φ440× 10t. After heat treatment at 400° C. for 1 hour, the entire rolled plate that was heated to the heat treatment temperature was rapidly cooled to give a target material, followed by machining into a target having a diameter of 430 mm and a thickness of 7 mm.

In Comparative Example 3, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 2.3 to give φ200 and then rolling at a rolling reduction of 50% to give φ440×10t. After heat treatment at 200° C. for 15 minutes, the entire rolled plate that was heated to the heat treatment temperature was rapidly cooled to give a target material, followed by machining into a target having a diameter of 430 mm and a thickness of 7 mm.

Table 3 shows the results of measurement of Mn compositions and electrical conductivities of these targets.

As shown in Table 3, the in-plane variation (CV value) of the Mn composition in Example 3 was 2.1% to give a target Subsequently, thin films were formed by sputtering the targets of Example 3 and Comparative Example 3 for evaluating the qualities of thin films formed by sputtering. The sheet resistance of each formed thin film was measured, and the uniformity in thickness of the film was calculated. The results are shown in Table 3.

As shown in Table 3, the thin film formed using the target of Example 3 has a thickness uniformity of 3.2%. Thus, the results show that the film thickness uniformity is satisfactory even if sputtering continues for a long time, compared to the film thickness uniformity of 4.3% in the case using the target of Comparative Example 3.

TABLE 3

|  | Forging ratio | Rolling reduction (%) | Heat treatment temperature (° C.) | Heat treatment time (min) | Mn composition In-plane CV value (%) | | Electrical conductivity In-plane CV value (%) | | Uniformity (Life average) |
|---|---|---|---|---|---|---|---|---|---|
| Example 3 | 4.8 | 70 | 400 | 60 | ○ | 2.1 | ○ | 2.4 | 3.2 |
| Comparative Example 3 | 2.3 | 50 | 200 | 15 | x | 3.7 | x | 4.2 | 4.3 |

Example 4 and Comparative Example 4

In Example 4, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 60t, followed by forging at a forging ratio of 4.8 to give φ200 and then rolling at a rolling reduction of 90% to give φ440× 10t. After heat treatment at 400° C. for 1 hour, the entire rolled plate that was heated to the heat treatment temperature was rapidly cooled to give a target material, followed by machining into a target having a diameter of 430 mm and a thickness of 7 mm.

In Comparative Example 4, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 2.3 to give φ200 and then rolling at a rolling reduction of 40% to give φ440×10t. After heat treatment at 200° C. for 15 minutes, the entire rolled plate that was heated to the heat treatment temperature was rapidly cooled to give a target material, followed by machining into a target having a diameter of 430 mm and a thickness of 7 mm.

Table 4 shows the results of measurement of Mn composition, Vickers hardness, and electrical conductivity of these targets.

As shown in Table 4, the in-plane variation (CV value) of the Mn composition in Example 4 was 2.7% to give a target having a lower variation of the Mn composition compared to 4.6% in Comparative Example 4. The in-plane variation (CV value) of the Vickers hardness in Example 4 was 12.4% to give a target having a lower variation of the Vickers hardness compared to 15.2% in Comparative Example 4. The in-plane variation (CV value) of the electrical conductivity in Example 4 was 2.9% to give a target having a lower variation of the electrical conductivity compared to 3.4% in Comparative Example 3.

Subsequently, thin films were formed by sputtering the targets of Example 4 and Comparative Example 4 for evaluating the qualities of thin films formed by sputtering. The sheet resistance of each formed thin film was measured, and the uniformity in thickness of the film was calculated. The results are shown in Table 4.

As shown in Table 4, the thin film formed using the target of Example 4 has a thickness uniformity of 2.5%. Thus, the results show that the film thickness uniformity is satisfactory even if sputtering continues for a long time, compared to the film thickness uniformity of 4.9% in the case using the target of Comparative Example 4.

and then rolling at a rolling reduction of 60% to give φ440×10t. After heat treatment at 350° C. for 2 hours, the entire rolled plate that was heated to the heat treatment temperature was rapidly cooled to give a target material, followed by machining into a target having a diameter of 430 mm and a thickness of 7 mm.

In Comparative Example 5, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 2.3 to give φ200 and then rolling at a rolling reduction of 50% to give φ440×10t. After heat treatment at 300° C. for 30 minutes, the entire rolled plate that was heated to the heat treatment temperature was rapidly cooled to give a target material, followed by machining into a target having a diameter of 430 mm and a thickness of 7 mm.

Table 5 shows the results of measurement of Mn compositions and thermal conductivities of these targets.

As shown in Table 5, the in-plane variation (CV value) of the Mn composition in Example 5 was 2.4% to give a target having a lower variation of the Mn composition compared to 3.9% in Comparative Example 5. The in-plane variation (CV value) of the thermal conductivity in Example 5 was 4.7% to give a target having a lower in-plane variation of the thermal conductivity compared to 5.9% in Comparative Example 5.

Subsequently, thin films were formed by sputtering the targets of Example 5 and Comparative Example 5 for evalu-

TABLE 4

| | Forging ratio | Rolling reduction (%) | Heat treatment temperature (° C.) | Heat treatment time (min) | Mn composition In-plane CV value (%) | | Hardness In-plane CV value (%) | | Electrical conductivity In-plane CV value (%) | | Uniformity (Life average) |
|---|---|---|---|---|---|---|---|---|---|---|---|
| Example 4 | 4.8 | 90 | 400 | 60 | ○ | 2.7 | ○ | 12.4 | ○ | 2.9 | 2.5 |
| Comparative Example 4 | 2.3 | 40 | 200 | 15 | x | 4.6 | x | 15.2 | x | 3.4 | 4.9 |

Example 5 and Comparative Example 5

In Example 5, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 4.8 to give φ200 ating the qualities of thin films formed by sputtering. The sheet resistance of each formed thin film was measured, and the uniformity in thickness of the film was calculated. The results are shown in Table 5.

As shown in Table 5, the thin film formed using the target of Example 5 has a thickness uniformity of 2.7%. Thus, the results show that the film thickness uniformity is satisfactory even if sputtering continues for a long time, compared to the film thickness uniformity of 4.7% in the case using the target of Comparative Example 5.

TABLE 5

|  | Forging ratio | Rolling reduction (%) | Heat treatment temperature (° C.) | Heat treatment time (min) | Mn composition In-plane CV value (%) | | Thermal conductivity In-plane CV value (%) | | Uniformity (Life average) |
|---|---|---|---|---|---|---|---|---|---|
| Example 5 | 4.8 | 60 | 350 | 120 | ○ | 2.4 | ○ | 4.7 | 2.7 |
| Comparative Example 5 | 2.3 | 50 | 300 | 30 | x | 3.9 | x | 5.9 | 4.7 |

Example 6 and Comparative Example 6

In Example 6, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 60t, followed by forging at a forging ratio of 4.8 to give φ200 and then rolling at a rolling reduction of 80% to give φ440× 10t. After heat treatment at 350° C. for 2 hours, the entire rolled plate that was heated to the heat treatment temperature was rapidly cooled to give a target material, followed by machining into a target having a diameter of 430 mm and a thickness of 7 mm.

In Comparative Example 6, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 2.3 to give φ200 and then rolling at a rolling reduction of 30% to give φ440×10t. After heat treatment at 300° C. for 30 minutes, the entire rolled plate that was heated to the heat treatment temperature was rapidly cooled to give a target material, followed by machining into a target having a diameter of 430 mm and a thickness of 7 mm.

Table 6 shows the results of measurement of Mn composition, Vickers hardness, and thermal conductivity of these targets.

As shown in Table 6, the in-plane variation (CV value) of the Mn composition in Example 6 was 2.2% to give a target having a lower variation of the Mn composition compared to 4.2% in Comparative Example 6. The in-plane variation (CV value) of the Vickers hardness in Example 6 was 14.8% to give a target having a lower in-plane variation of the Vickers hardness compared to 19.2% in Comparative Example 6. The in-plane variation (CV value) of the thermal conductivity in Example 6 was 3.3% to give a target having a lower in-plane variation of the thermal conductivity compared to 5.2% in Comparative Example 6.

Subsequently, thin films were formed by sputtering the targets of Example 6 and Comparative Example 6 for evaluating the qualities of thin films formed by sputtering. The sheet resistance of each formed thin film was measured, and the uniformity in thickness of the film was calculated. The results are shown in Table 6.

As shown in Table 6, the thin film formed using the target of Example 6 has a thickness uniformity of 2.4%. Thus, the results show that the film thickness uniformity is satisfactory even if sputtering continues for a long time, compared to the film thickness uniformity of 5.2% in the case using the target of Comparative Example 6.

TABLE 6

|  | Forging ratio | Rolling reduction (%) | Heat treatment temperature (° C.) | Heat treatment time (min) | Mn composition In-plane CV value (%) | | Hardness In-plane CV value (%) | | Thermal conductivity In-plane CV value (%) | | Uniformity (Life average) |
|---|---|---|---|---|---|---|---|---|---|---|---|
| Example 6 | 4.8 | 80 | 350 | 120 | ○ | 2.2 | ○ | 14.8 | ○ | 3.3 | 2.4 |
| Comparative Example 6 | 2.3 | 30 | 300 | 30 | x | 4.2 | x | 19.2 | x | 5.2 | 5.2 |

Example 7 and Comparative Example 7

In Example 7, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 60t, followed by forging at a forging ratio of 4.8 to give φ200 and then rolling at a rolling reduction of 70% to give φ440× 10t. After heat treatment at 400° C. for 2 hours, the entire rolled plate that was heated to the heat treatment temperature was rapidly cooled to give a target material, followed by machining into a target having a diameter of 430 mm and a thickness of 7 mm.

In Comparative Example 7, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 2.3 to give φ200 and then rolling at a rolling reduction of 50% to give φ440×10t. After heat treatment at 200° C. for 30 minutes, the entire rolled plate that was heated to the heat treatment temperature was rapidly cooled to give a target material, followed by machining into a target having a diameter of 430 mm and a thickness of 7 mm.

Table 7 shows the results of measurement of Mn compositions, electrical conductivities, and thermal conductivities of these targets.

As shown in Table 7, the in-plane variation (CV value) of the Mn composition in Example 7 was 2.3% to give a target having a lower variation of the Mn composition compared to 3.9% in Comparative Example 7. The in-plane variation (CV value) of the electrical conductivity in Example 7 was 2.6% to give a target having a lower in-plane variation of the electrical conductivity compared to 4.7% in Comparative Example 7. The in-plane variation (CV value) of the thermal conductivity in Example 7 was 4.5% to give a target having a lower in-plane variation of the thermal conductivity compared to 5.4% in Comparative Example 7.

Subsequently, thin films were formed by sputtering the targets of Example 7 and Comparative Example 7 for evaluating the qualities of thin films formed by sputtering. The sheet resistance of each formed thin film was measured, and the uniformity in thickness of the film was calculated. The results are shown in Table 7.

As shown in Table 7, the thin film formed using the target of Example 7 has a thickness uniformity of 2.8%. Thus, the results show that the film thickness uniformity is satisfactory even if sputtering continues for a long time, compared to the film thickness uniformity of 4.8% in the case using the target of Comparative Example 7.

was rapidly cooled to give a target material, followed by machining into a target having a diameter of 430 mm and a thickness of 7 mm.

In Comparative Example 8, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 2.3 to give φ200 and then rolling at a rolling reduction of 30% to give φ440×10t. After heat treatment at 200° C. for 30 minutes, the entire rolled plate that was heated to the heat treatment temperature was rapidly cooled to give a target material, followed by machining into a target having a diameter of 430 mm and a thickness of 7 mm.

Table 8 shows the results of measurements of Mn composition, Vickers hardness, electrical conductivity, and thermal conductivity of these targets. As shown in Table 8, the in-plane variation (CV value) of the Mn composition in Example 8 was 2.3% to give a target having a lower variation of the Mn composition compared to 4.3% in Comparative Example 8. The in-plane variation (CV value) of the Vickers hardness in Example 8 was 13.8% to give a target having a lower in-plane variation of the Vickers hardness compared to 18.0% in Comparative Example 8. The in-plane variation (CV value) of the electrical conductivity in Example 8 was 2.8% to give a target having a lower in-plane variation of the electrical conductiv-

TABLE 7

| | Forging ratio | Rolling reduction (%) | Heat treatment temperature (° C.) | Heat treatment time (min) | Mn composition In-plane CV value (%) | | Electrical conductivity In-plane CV value (%) | | Thermal conductivity In-plane CV value (%) | | Uniformity (Life average) |
|---|---|---|---|---|---|---|---|---|---|---|---|
| Example 7 | 4.8 | 70 | 400 | 120 | ○ | 2.3 | ○ | 2.6 | ○ | 4.5 | 2.8 |
| Comparative Example 7 | 2.3 | 50 | 200 | 30 | x | 3.9 | x | 4.7 | x | 5.4 | 4.8 |

Example 8 and Comparative Example 8

In Example 8, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×60t, followed by forging at a forging ratio of 4.8 to give φ200 and then rolling at a rolling reduction of 90% to give φ440×10t. After heat treatment at 400° C. for 2 hours, the entire rolled plate that was heated to the heat treatment temperature ity compared to 5.2% in Comparative Example 8. The in-plane variation (CV value) of the thermal conductivity in Example 8 was 2.6% to give a target having a lower in-plane variation of the thermal conductivity compared to 5.3% in Comparative Example 8.

Subsequently, thin films were formed by sputtering the targets of Example 8 and Comparative Example 8 for evaluating the qualities of thin films formed by sputtering. The sheet resistance of each formed thin film was measured, and the uniformity in thickness of the film was calculated. The results are shown in Table 8.

As shown in Table 8, the thin film formed using the target of Example 8 has a thickness uniformity of 3.1%. Thus, the results show that the film thickness uniformity is satisfactory even if sputtering continues for a long time, compared to the film thickness uniformity of 4.6% in the case using the target of Comparative Example 8.

TABLE 8

| | Forging ratio | Rolling reduction (%) | Heat treatment temperature (° C.) | Heat treatment time (min) | Mn composition In-plane CV value (%) | | Hardness In-plane CV value (%) | | Electrical conductivity In-plane CV value (%) | | Thermal conductivity In-plane CV value (%) | | Uniformity (Life average) |
|---|---|---|---|---|---|---|---|---|---|---|---|---|---|
| Example 8 | 4.8 | 90 | 400 | 120 | ○ | 2.3 | ○ | 13.8 | ○ | 2.8 | ○ | 2.6 | 3.1 |
| Comparative Example 8 | 2.3 | 30 | 200 | 30 | x | 4.3 | x | 18.0 | x | 5.2 | x | 5.3 | 4.6 |

Example 9 and Comparative Example 9

In Example 9, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 151t, followed by forging at a forging ratio of 4.8 to give φ220 and then rolling at a rolling reduction of 90% to give φ700× 10t. After heat treatment at 400° C. for 2 hours, the entire rolled plate that was heated to the heat treatment temperature was rapidly cooled to give a target material, followed by machining into a target having a diameter of 650 mm and a thickness of 7 mm.

In Comparative Example 9, high-purity copper (Cu) having a purity of 6 N was melted in a carbon crucible under a high vacuum atmosphere. High-purity manganese (Mn) having a purity of 5 N was adjusted so that the amount of Mn would have 1 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180×151t, followed by forging at a forging ratio of 2.3 to give φ400 and then rolling at a rolling reduction of 30% to give φ700×10t. After heat treatment at 200° C. for 30 minutes, the entire rolled plate that was heated to the heat treatment temperature was rapidly cooled to give a target material, followed by machining into a target having a diameter of 650 mm and a thickness of 7 mm.

Table 9 shows the results of measurements of Mn composition, Vickers hardness, electrical conductivity, and thermal conductivity of these targets. As shown in Table 9, the in-plane variation (CV value) of the Mn composition in Example 9 was 2.2% to give a target having a lower variation of the Mn composition compared to 4.4% in Comparative Example 9. The in-plane variation (CV value) of the Vickers hardness in Example 9 was 13.6% to give a target having a lower in-plane variation of the Vickers hardness compared to 18.2% in Comparative Example 9. The in-plane variation (CV value) of the electrical conductivity in Example 9 was 2.6% to give a target having a lower in-plane variation of the electrical conductivity compared to 5.3% in Comparative Example 9. The in-plane variation (CV value) of the thermal conductivity in Example 9 was 2.7% to give a target having a lower in-plane variation of the thermal conductivity compared to 5.4% in Comparative Example 9. The results shown in Tables 8 and 9 demonstrate that the in-plane variations in Mn composition, Vickers hardness, electrical conductivity, and thermal conductivity do not depend on the target diameter.

TABLE 9

| | Forging ratio | Rolling reduction (%) | Heat treatment temperature (° C.) | Heat treatment time (min) | Mn composition In-plane CV value (%) | | Hardness In-plane CV value (%) | | Electrical conductivity In-plane CV value (%) | | Thermal conductivity In-plane CV value (%) | |
|---|---|---|---|---|---|---|---|---|---|---|---|---|
| Example 9 | 4.8 | 90 | 400 | 120 | ○ | 2.2 | ○ | 13.6 | ○ | 2.6 | ○ | 2.7 |
| Comparative Example 9 | 2.3 | 30 | 200 | 30 | x | 4.4 | x | 18.2 | x | 5.3 | x | 5.4 |

Examples 10, 11 and 12

In Example 10, high-purity copper (Cu) having a purity of 6 N was melted in a carbon crucible under a high vacuum atmosphere. High-purity manganese (Mn) having a purity of 5 N was adjusted so that the amount of Mn would have 0.5 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 151t, followed by forging at a forging ratio of 4.8 to give φ220 and then rolling at a rolling reduction of 90% to give φ700× 10t. After heat treatment at 400° C. for 2 hours, the entire rolled plate that was heated to the heat treatment temperature was rapidly cooled to give a target material, followed by machining into a target having a diameter of 650 mm and a thickness of 7 mm.

In Example 11, high-purity copper (Cu) having a purity of 6 N was melted in a carbon crucible under a high vacuum atmosphere. High-purity manganese (Mn) having a purity of 5 N was adjusted so that the amount of Mn would have 10 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 151t, followed by forging at a forging ratio of 4.8 to give φ220 and then rolling at a rolling reduction of 90% to give φ700× 10t. After heat treatment at 400° C. for 2 hours, the entire rolled plate that was heated to the heat treatment temperature was rapidly cooled to give a target material, followed by machining into a target having a diameter of 650 mm and a thickness of 7 mm.

In Example 12, high-purity copper (Cu) having a purity of 6 N was melted in a carbon crucible under a high vacuum atmosphere. High-purity manganese (Mn) having a purity of 5 N was adjusted so that the amount of Mn would have 15 wt %, and was charged into the molten copper. The molten copper-manganese alloy prepared by charging and melting Mn was cast in a water-cooled copper mold under a high vacuum atmosphere to give an ingot. Subsequently, the surface layer of the produced ingot was removed to give φ180× 151t, followed by forging at a forging ratio of 4.8 to give φ220 and then rolling at a rolling reduction of 90% to give φ700× 10t. After heat treatment at 400° C. for 2 hours, the entire rolled plate that was heated to the heat treatment temperature was rapidly cooled to give a target material, followed by machining into a target having a diameter of 650 mm and a thickness of 7 mm.

Table 10 shows the results of measurement of Mn composition, Vickers hardness, electrical conductivity, and thermal conductivity of these targets.

As shown in Table 10, the in-plane variation (CV value) of the Mn composition in Example 10 was 2.1%, the in-plane variation (CV value) of the Mn composition in Example 11 was 2.2%, and the in-plane variation (CV value) of the Mn composition in Example 12 was 2.2%. Thus, targets each showing a low in-plane variation in Mn composition were obtained. The in-plane variation (CV value) of the Vickers hardness in Example 10 was 13.2%, the in-plane variation (CV value) of the Vickers hardness in Example 11 was 12.3%, and the in-plane variation (CV value) of the Vickers hardness in Example 12 was 11.9%. Thus, targets each showing a low in-plane variation in hardness were obtained. The in-plane variation (CV value) of the electrical conductivity in Example 10 was 2.3%, the in-plane variation (CV value) of the electrical conductivity in Example 11 was 2.2%, and the in-plane variation (CV value) of the electrical conductivity in Example 12 was 2.6%. Thus, targets each showing a low in-plane variation in electrical conductivity were obtained. The in-plane variation (CV value) of the thermal conductivity in Example 10 was 2.1%, the in-plane variation (CV value) of the thermal conductivity in Example 11 was 2.4%, and the in-plane variation (CV value) of the thermal conductivity in Example 12 was 2.6%. Thus, targets each showing a low in-plane variation in thermal conductivity were obtained.

It was confirmed by Examples 10 to 12 that similar effects can be obtained as long as the amount of Mn is within 0.05 to 20 wt %.

The present invention provides a copper-manganese alloy sputtering target and improves the quality of a film formed by sputtering by adding an appropriate amount of a Mn element to copper and reducing the in-plane variation of the sputtering target. In particular, the invention has excellent effects of improving the yield and the reliability of semiconductor products which have made progress in a degree of refinement and integration. In addition, the invention is useful for forming semiconductor copper-manganese-alloy wiring having a self-diffusion suppression function, capable of effectively preventing the periphery of the wiring from being contaminated by diffusion of active Cu, and having excellent, for example, electron migration (EM) resistance and corrosion resistance.

The invention claimed is:

1. A high-purity copper-manganese-alloy sputtering target comprising 0.05 to 20 wt % of Mn and the remainder being Cu and inevitable impurities, wherein the target has an in-plane variation (CV value) in Mn concentration of 3% or less.

2. The high-purity copper-manganese-alloy sputtering target comprising 0.05 to 20 wt % of Mn and the remainder being Cu and inevitable impurities according to claim 1, wherein the target has an in-plane variation (CV value) in Vickers hardness of 15% or less.

3. The high-purity copper-manganese-alloy sputtering target comprising 0.05 to 20 wt % of Mn and the remainder being Cu and inevitable impurities according to claim 2, wherein the target has an in-plane variation (CV value) in electrical conductivity of 3% or less.

4. The high-purity copper-manganese-alloy sputtering target comprising 0.05 to 20 wt % of Mn and the remainder being Cu and inevitable impurities according to claim 3, wherein the target has an in-plane variation (CV value) in thermal conductivity of 5% or less.

5. The high-purity copper-manganese-alloy sputtering target according to claim 1, wherein the target has an in-plane variation (CV value) in electrical conductivity of 3% or less.

6. The high-purity copper-manganese-alloy sputtering target according to claim 5, wherein the target has an in-plane variation (CV value) in thermal conductivity of 5% or less.

7. The high-purity copper-manganese-alloy sputtering target according to claim 1, wherein the target has an in-plane variation (CV value) in thermal conductivity of 5% or less.

TABLE 10

| | Mn composition (wt %) | Forging ratio | Rolling reduction (%) | Heat treatment temperature (° C.) | Heat treatment time (min) | Mn composition In-plane CV value (%) | | Hardness In-plane CV value (%) | | Electrical conductivity In-plane CV value (%) | | Thermal conductivity In-plane CV value (%) | |
|---|---|---|---|---|---|---|---|---|---|---|---|---|---|
| Example 10 | 0.5 | 4.8 | 90 | 400 | 120 | ○ | 2.1 | ○ | 13.2 | ○ | 2.3 | ○ | 2.1 |
| Example 11 | 10 | 4.8 | 90 | 400 | 120 | ○ | 2.2 | ○ | 12.3 | ○ | 2.2 | ○ | 2.4 |
| Example 12 | 15 | 4.8 | 90 | 400 | 120 | ○ | 2.2 | ○ | 11.9 | ○ | 2.6 | ○ | 2.6 |

* * * * *